United States Statutory Invention Registration [19]

[11] Reg. Number: H372

Campbell

[43] Published: Nov. 3, 1987

[54] PIEZOELECTRIC CHARGING DEVICE

[75] Inventor: Frederick C. Campbell, Meridianville, Ala.

[73] Assignee: The United States of America as represented by the Secretary of the Army, Washington, D.C.

[21] Appl. No.: 38,384

[22] Filed: Apr. 6, 1987

[51] Int. Cl.[4] ..... H01L 41/08

[52] U.S. Cl. ..... 310/339

*Primary Examiner*—Stephen C. Buczinski
*Assistant Examiner*—Linda J. Wallace
*Attorney, Agent, or Firm*—John C. Garvin, Jr.; Freddie M. Bush; James T. Deaton

[57] ABSTRACT

A piezoelectric charging device in which a rocket with a rocket motor utilizes pressure from the rocket motor to squeeze a piezoelectric crystal and utilizes the current produced from squeezing the piezoelectric crystal in a full wave bridge circuit to charge a capacitor that can then be used as a power source for a warhead.

3 Claims, 5 Drawing Figures

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

PIEZOELECTRIC CHARGING DEVICE

DEDICATORY CLAUSE

The invention described herein may be manufactured, used, and licensed by or for the Government for governmental purposes without the payment to me of any royalties thereon.

BACKGROUND OF THE INVENTION

In the past, some missiles have used a complicated and fairly expensive thermal battery circuit to charge a capacitor before flight of the missile in order to provide an energy source for a detonator of the warhead. These systems are too expensive and require more sophisticated circuitry than is desirable.

Therefore, it is an object of this invention to provide a simple piezoelectric charging device that utilizes pressure from the rocket motor to cause a piezoelectric crystal to produce sufficient energy to charge a capacitor that can be used to cause detonation of a detonator for a warhead.

Another object of this invention is to provide a simple device that utilizes a simple bridge circuit in causing the energy to be stored in a capacitor.

Still another object of this invention is to provide for detonator safety in that the system of applicant's allows the detonator power supply to be physically isolated from other power supplies.

Yet another object of this invention is to provide a charging arrangement that eliminates the need for costly charging circuits.

A further object of this invention is to provide a system that has few components in the charging circuit and therefore less chance of failure.

Other objects and advantages of this invention will be obvious to those skilled in this art.

SUMMARY OF THE INVENTION

In accordance with this invention, a piezoelectric charging device is provided and includes a housing with a piezoelectric crystal mounted therein with electrical leads mounted at opposite sides of the piezoelectric crystal with pressure applying means at one end and in communication with the gas pressure from a rocket motor casing to apply pressure to the crystal when the rocket motor is ignited and cause an output to be produced at the electrical leads for the crystal and applying the output leads to a bridge circuit that has a capacitor connected thereacross and utilizing the energy stored in the capacitor as a power supply for setting off the detonator for a warhead.

DESCRIPTION OF THE PREFERRED EMBODIMENT

Figure 1:
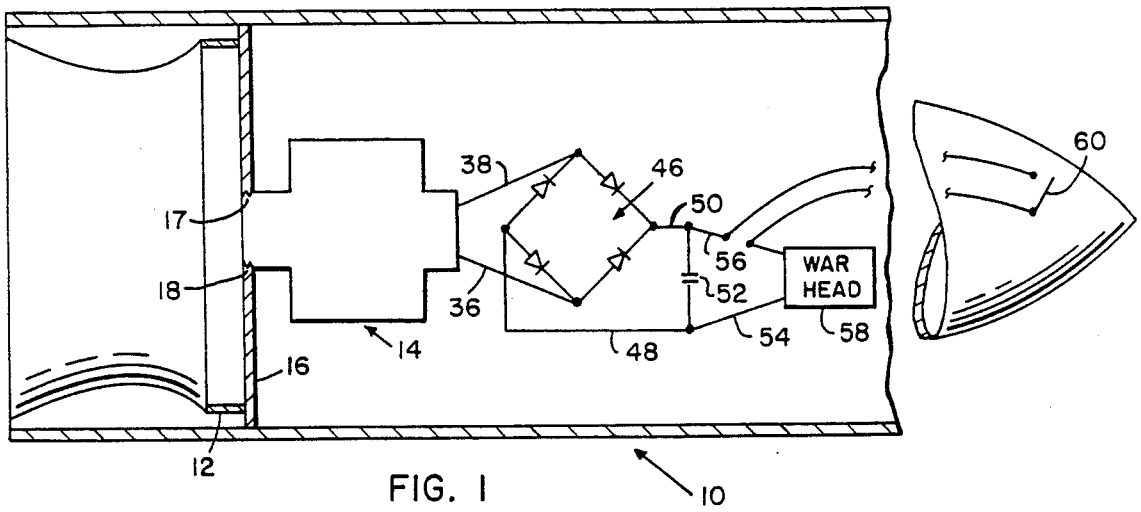
FIG. 1 is a sectional view with a portion of the rocket cut-way and schematically illustrating the piezoelectric charging device in accordance with this invention.

Referring now to the drawings, rocket 10 includes a conventional rocket motor 12 with piezoelectric unit 14 secured to front end 16 of rocket 12 in a conventional manner such as by threads 17 on member 16 and threads 18 on piezoelectric unit 14. Piezoelectric unit 14 includes an outer housing 20 and inner mounting structure 22 that is made of insulating material. A threaded insulating plug 24 and threads 25 at end 26 of housing structure 22 are threaded together to hold insulating structure 22 in place in housing 20. Insulating structure 22 has a bore 28 at one end thereof and piezoelectric crystal 30 is mounted in bore 28 with metal plates 32 and 34 at opposite ends of piezoelectric crystal 30. Plate 34 has electrical lead 36 connected thereto and extends out through plug structure 24 as illustrated and plate 32 has lead 38 connected thereto and extends through plug 24 as illustrated. A piston 40 with an O-ring type seal 42 is slidably and sealably mounted in bore 44 at one end of housing structure 20. Lead 36 is connected to one terminal of full wave bridge rectifier circuit 46 and lead 38 is connected to an opposite terminal of full wave bridge circuit 46 as illustrated. The other two terminals of full wave bridge circuit 46 are connected by leads 48 and 50 across capacitor 52 and output leads 54 and 56 from capacitor 52 are connected to a detonator and warhead structure 58. Lead 56 has a conventional crush type switch 60 connected therein for completing the circuit to warhead 58 upon the missile arriving at the target.

Figure 3:
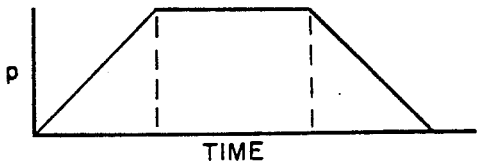
FIG. 3 is a graph illustrating pressure versus time.
Figure 4:
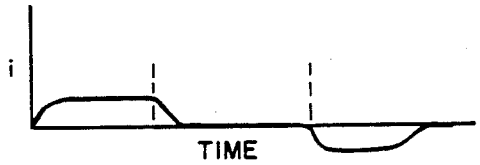
FIG. 4 is a graph illustrating current versus time.
Figure 5:
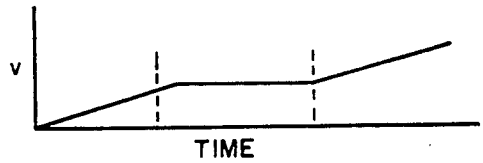
FIG. 5 is a graph illustrating voltage versus time.
Figure 2:
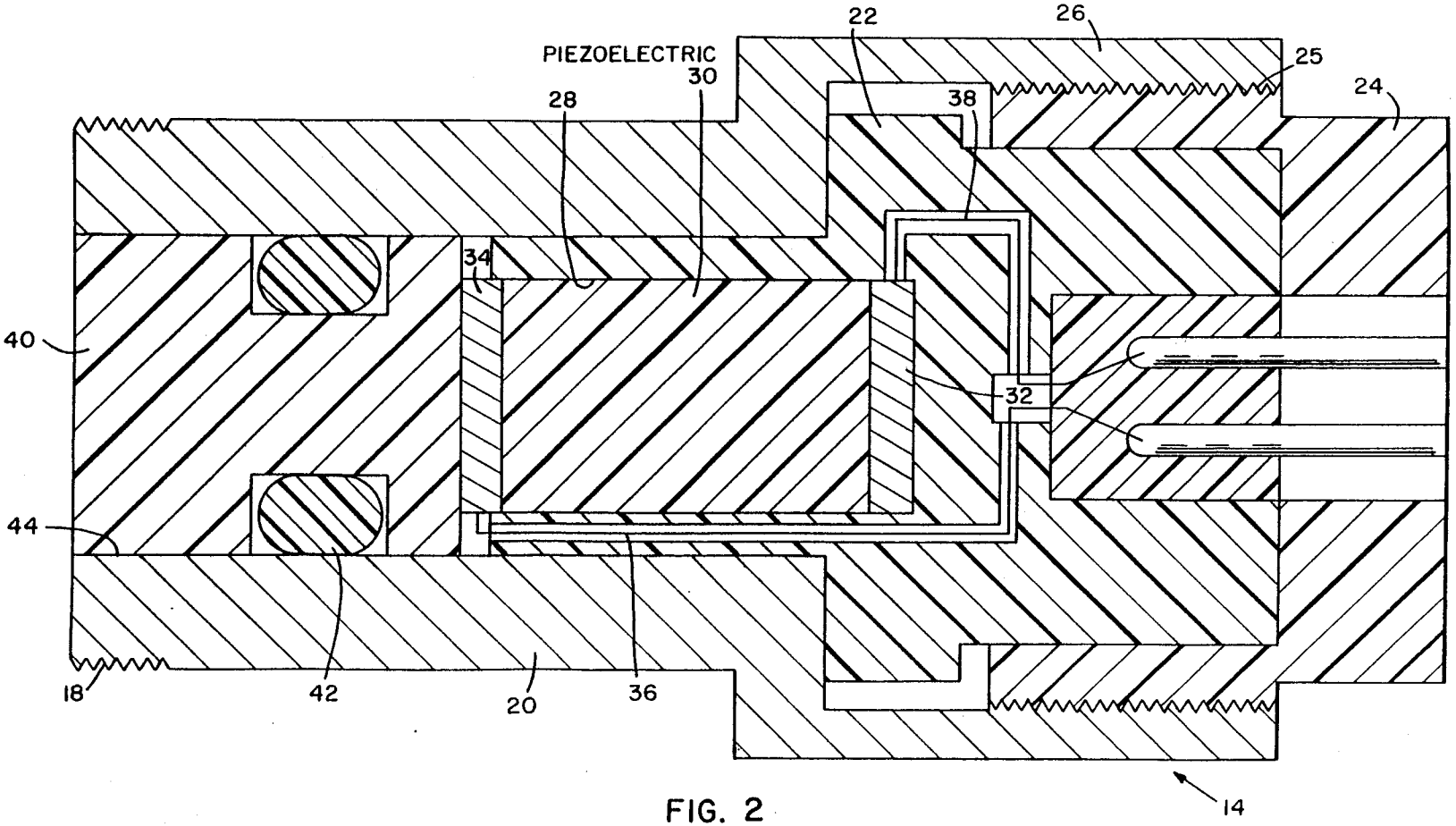
FIG. 2 is a sectional view of a structure illustrating the mounting of the piezoelectric crystal with the application of force thereto and leads connected to an electric circuit from the piezoelectric crystal.

In operation, when it is desired to launch rocket 10, motor 12 is ignited in a conventional manner to propel rocket 10 toward a desired target and when rocket motor 12 is ignited, fluid pressure from the rocket motor is communicated to piston 40 which exerts pressure on plates 32 and 34 to squeeze crystal 30 and cause an output to be produced across leads 36 and 38 to full wave rectifier 46 and from full wave rectifier 46 to leads 48 and 50 to capacitor 52 to store the produced energy in capacitor 52. Capacitor 52 then becomes a power supply source for an explosive charge detonator of warhead 58 to set warhead 58 off at the target. Switch 60 is closed when the rocket strikes the target and completes the circuit to the explosive charge detonator and causes warhead 58 to be set off. When rocket motor 12 is ignited, the pressure first rises and then falls therein at burn out in relation to time as illustrated in FIG. 3, current from crystal 30 is produced as illustrated in FIG. 4 in relation to the rise and fall of the pressure in rocket motor 12, full wave bridge recitifier circuit 46 causes energy as illustrated in FIG. 5 to be stored in capacitor 52 as a power supply, and switch 60 is closed upon contacting the target to cause the stored energy in capacitor 52 to be connected across the explosive charge detonator to set off warhead 58

I claim:

1. A piezoelectric charging device comprising a housing having a piezoelectric crystal mounted therein in an insulating structure with electrically conductive plates mounted at opposite ends of the crystal with electrical leads connected to the plates, means for applying force to the plates and said crystal, said leads being connected to a full wave bridge circuit at two connecting points, and said full wave bridge circuits having two additional connecting points that are connected by leads across a capacitor for storing energy in the capacitor.

2. A piezoelectric charging device as set forth in claim 1, wherein said means for applying force to said crystal includes a piston mounted in a housing for supporting said crystal and said plates and said housing being connected to a rocket motor for receiving pressure from fluid within the rocket motor for applying the pressure of the rocket motor to said piston to squeeze said crystal.

3. A piezoelectric charging device as set forth in claim 2, wherein a warhead is connected by control lead means across said capacitor for having energy stored in said capacitor applied to explosive means of said warhead when desired.

* * * * *